United States Patent [19]

Endo

[11] Patent Number: 4,890,022
[45] Date of Patent: Dec. 26, 1989

[54] DELAY CIRCUIT DEVICE UTILIZING THE MILLER EFFECT

[75] Inventor: Hideaki Endo, Tokyo, Japan

[73] Assignee: Oki Electric Industry, Ltd., Tokyo, Japan

[21] Appl. No.: 174,447

[22] Filed: Mar. 25, 1988

[30] Foreign Application Priority Data

Mar. 26, 1987 [JP] Japan ................................. 62-72746

[51] Int. Cl.[4] ........................ H03K 5/13; H03K 17/56
[52] U.S. Cl. ..................................... 307/602; 307/603; 307/606; 307/595; 307/597; 307/246; 307/594
[58] Field of Search ............... 307/591, 595, 597, 511, 307/602, 603, 606, 246, 594, 605; 328/55, 66, 155

[56] References Cited

U.S. PATENT DOCUMENTS

| 4,553,050 | 11/1985 | Feinberg et al. | 307/246 |
| 4,623,805 | 11/1986 | Flora et al. | 307/606 |
| 4,687,949 | 8/1987 | Yasuda | 307/606 |
| 4,717,843 | 1/1988 | Yoshimura | 328/55 |
| 4,760,291 | 7/1988 | Nakajima et al. | 328/55 |
| 4,797,575 | 1/1989 | Lofgren | 307/602 |

FOREIGN PATENT DOCUMENTS

60-33733 2/1985 Japan .

Primary Examiner—John S. Heyman
Assistant Examiner—Trong Quang Phan
Attorney, Agent, or Firm—Wenderoth, Lind & Ponack

[57] ABSTRACT

A delay circuit for an integrated circuit or a circuit mounted on a printed board regulates the signal transfer time of a signal transfer line by utilizing the Miller effect without using any delay element to delay a signal properly according to an operating mode of the circuit. The delay device includes a first line for transferring a first signal, and a second line or a plurality of second lines provided near the first line. The signal transfer time of the first line in transferring the first signal is determined selectively by applying a second signal of the same phase as that of the first signal or of a phase opposite to that of the first signal to the second line or selectively to one of the plurality of second lines.

6 Claims, 7 Drawing Sheets

| INVERTER | NMOS | PMOS |
|---|---|---|
| GATE WIDTH W / GATE LENGTH L ($\mu$m/$\mu$m) | 6/2 | 12/2 |
| THRESHOLD VOLTAGE $V_t$ (V) | 0.57 | 0.61 |
| DRIFT MOBILITY $\mu$ (cm$^2$/V·s) | 460 | 240 |

FIG. 3

| RELATIVE PHASE BETWEEN FIRST LINE 30 AND SECOND LINE 31 | TRANSFER DELAY TIME Tpd HL (ns) | TRANSFER DELAY TIME Tpd LH (ns) | AVERAGE TRANSFER DELAY TIME (ns) | AVERAGE DELAY TIME RATIO |
|---|---|---|---|---|
| IN-PHASE | 6.5 | 7.8 | 7.2 | 1 |
| INVERTED PHASE | 9.4 | 11.8 | 10.6 | 1.5 |

DELAY CIRCUIT

FIG. 6

| PHASE MODE RELATIVE TO FIRST LINE 50 | | TRANSFER DELAY TIME Tpd HL (ns) | TRANSFER DELAY TIME Tpd LH (ns) | AVERAGE TRANSFER DELAY TIME (ns) | AVERAGE DELAY TIME RATIO |
|---|---|---|---|---|---|
| SECOND LINE 51 | SECOND LINE 52 | | | | |
| IN-PHASE | IN-PHASE | 6.5 | 7.8 | 7.2 | 1 |
| IN-PHASE | INVERTED PHASE | 7.7 | 9.5 | 8.6 | 1.19 |
| INVERTED PHASE | IN-PHASE | 9.1 | 11.3 | 10.2 | 1.42 |
| INVERTED PHASE | INVERTED PHASE | 11.6 | 14.6 | 13.1 | 1.82 |

DELAY CIRCUIT DEVICE UTILIZING THE MILLER EFFECT

BACKGROUND OF THE INVENTION

1. Field of the Invention

The present invention relates to a delay circuit utilizing the Miller effect of a capacitance, suitable for integrated circuits and circuits mounted on a printed circuit board.

2. Description of the Prior Art

There have been proposed various delay circuits for delaying signal transmission to adjust the timing of operation in integrated circuits and circuits mounted on a printed circuit board.

Figure 11:
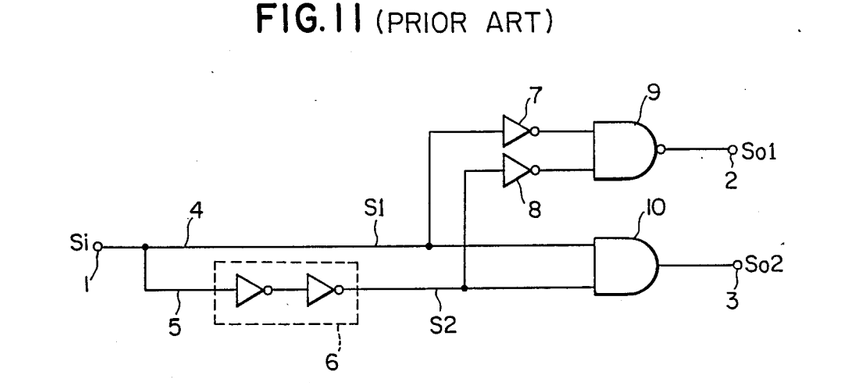
FIG. 11 is a circuit diagram of a conventional delay circuit.
Figure 12:
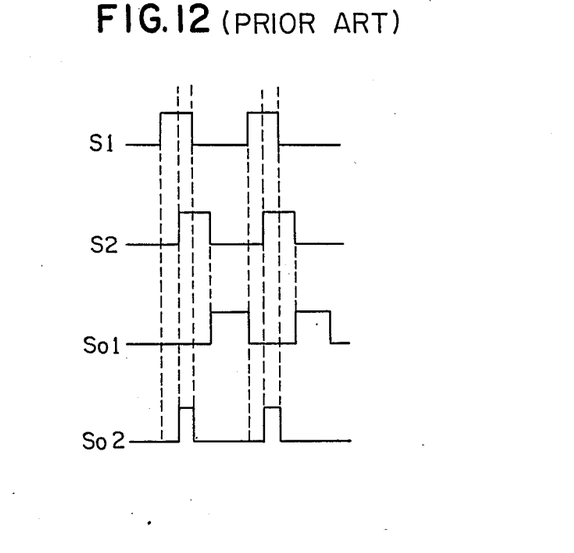
FIG. 12 is a waveform chart showing signals carried by the delay circuit of FIG. 11.

Shown in FIG. 11 is a conventional delay circuit. This delay circuit has an input terminal 1 to which a signal Si is applied, and two output terminals 2 and 3 at which signals So1 and So2 appear, respectively. Signal transmission lines 4 and 5 are connected to the input terminal 1. A delay circuit 6 comprising two inverters connected in series is provided in the line 5. An inverter 7 for signal inversion is connected to the line 4. An inverter 8 for signal inversion is connected to the output of the delay circuit 6. The respective outputs of the inverters 7 and 8 are connected to a NAND gate 9, and the output of the NAND gate is connected to the output terminal 2. The line 4 and the output of the delay circuit 6 are connected to an AND gate 10, and the output of the AND gate 10 is connected to the output terminal 3. In FIG. 12, S1 is a signal carried by the line 4, and S2 is a signal which appears at the output of the delay circuit 6.

FIG. 12 is a waveform chart showing the signals transferred through and appearing at the output terminals of the delay circuit of FIG. 11. The clock signal Si is applied to the input terminal 1 to obtain the two clock signals So1 and So2 which are not overlapping each other. The clock signal Si is delayed slightly by the capacitance of the line 4 to ground and is transmitted in the signal S1 through the line 4 to the inverter 7 and the AND gate 10. The clock signal Si is delayed by a predetermined time by the capacitance of the line 5 to ground and is transmitted in the signal S2 through the line 5 to the inverter 8 and the AND gate 10. The top logical product So2 of the signals S1 and S2 appears at the output terminal 3. The signals S1 and S2 are applied to the inputs of the NAND gate 9 after being inverted respectively by the inverters 7 and 8, and then the signal So1 appears at the output terminal 2. Thus, the two clock signals So1 and So2 having a predetermined phase difference therebetween are obtained.

Figure 13:
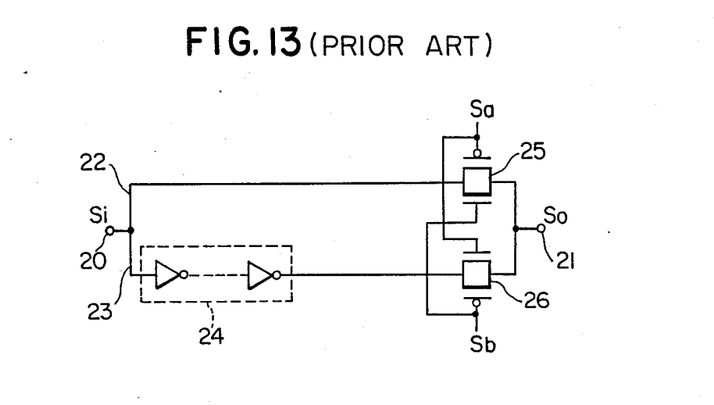
FIG. 13 is a circuit diagram of another conventional delay circuit.

Referring to FIG. 13 showing another conventional delay circuit, the delay circuit has an input terminal 20 to which a signal Si is applied, and an output terminal 21 at which an output signal So appears. Signal transmission lines 22 and 23 are connected to the input terminal 20. A delay circuit 24 comprising an even number of inverters is provided in the line 23. The line 22 is connected through a switch 25 which is controlled by a control signal Sa to the output terminal 21. The output of the delay circuit 24 is connected through a switch 26 which is controlled by an inversion control signal Sb to the output terminal 21. In using the line 22, the switch 25 is closed by the control signal Sa and is opened the switch 26 by the inversion control signal Sb. Then, the signal Si applied to the input terminal 20 is transmitted in the signal So through the switch 25 after being delayed by a time Tpd1 by the capacitance of the line 22 to ground and appears at the output terminal 21. In using the other line 23 to delay the signal Si more than a ordinary delay, the switch 25 is opened by the control signal Sa and the switch 26 is closed by the inversion control signal Sb. Then, the signal Si applied to the input terminal 20 is transmitted in the signal So through the switch 26 and appears at the output terminal 21 after being delayed by a time Tpd2 by the capacitance of the line 23 to ground and the delay circuit 24. Thus, the signal So delayed by the delay time Tpd1 or Tpd2 is obtained at the output terminal 21 by properly controlling the switches 25 and 26.

The conventional delay circuits 6 and 24, however, have the following problems.

The delay circuit 6 shown in FIG. 11 needs inverters, which increases the number of component devices and requires an increased size in area. Furthermore, the capacitance of the line 4 to ground delays signals and, when the lines 4 and 5 are disposed adjacently, a coupling capacitance between the lines 4 and 5 delays signals carried by the lines 4 and 5. Accordingly, it is possible that the two clock signals So1 and So2 having an accurate desired time interval therebetween cannot be obtained and the delay time of the delay circuit 6 is obliged to be redesigned.

The delay circuit 24 of FIG. 13, similarly to the delay circuit 6 of FIG. 11, increases the number of component devices and requires an increased size in area. Furthermore, the coupling capacitance between the lines 22 and 23 causes the delay time Tpd1 attributable to the capacitance of the line 22 to ground and the delay time Tpd2 attributable to the earth capacitance of the line 23 to ground to be delayed further by a time corresponding to the coupling capacitance, and hence it is difficult to determine an accurate delay time.

SUMMARY OF THE INVENTION

Accordingly, it is an object of the present invention to provide a delay circuit eliminating the problems in the conventional delay circuits including an increase in the number of component devices, an increase in the area and a difficulty in determining an accurate delay time.

To achieve the object of the invention, the present invention provides a delay circuit for delaying a signal by a predetermined time, comprising a first line for transmitting a first signal, and a second line disposed near the first line and coupled to the first line by capacitive coupling, in which a second signal of the same phase as that of the first signal or of opposite phase to that of the first signal is supplied to the second line 2 to vary the time for transmitting the first signal.

In the delay circuit thus constituted according to the present invention, when the second signal of a phase opposite to that of the first signal is supplied to the second line, the coupling capacitance between the first and second lines is almost doubled by the Miller effect, and hence the first signal carried by the first line is delayed by a time corresponding to the capacity of the first line to ground and the doubled coupling capacitance.

When the second signal of the same phase as that of the first signal is supplied to the second line, the coupling capacitance is almost negligibly small, and hence the first signal carried by the first line is delayed by a time corresponding to the capacitance of the first line to ground.

Thus, the delay time of the first signal can be varied by changing the polarity of the second signal, and the foregoing problems in the conventional delay circuits can thereby be eliminated.

BRIEF DESCRIPTION OF THE DRAWINGS

The above and other objects, features and advantages of the present invention will become apparent from the following description taken in conjunction with the accompanying drawings, in which.

DESCRIPTION OF THE PREFERRED EMBODIMENTS

Figure 1A:
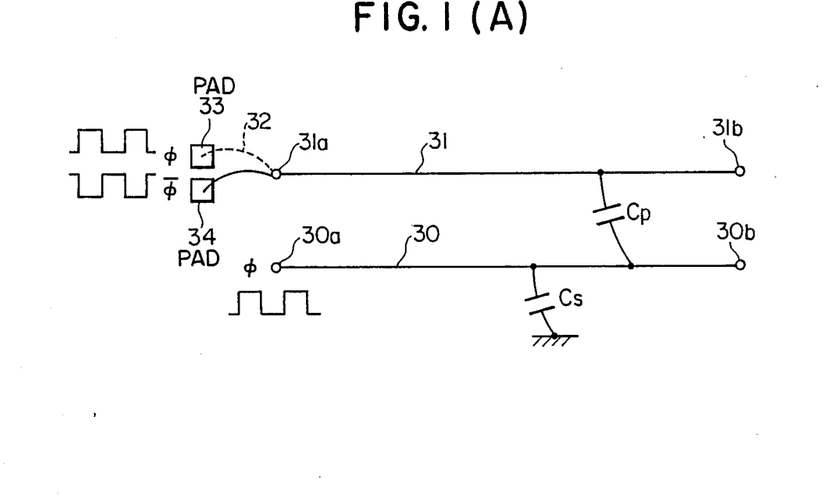
FIG. 1(A) is a circuit diagram of a delay circuit, in a first embodiment, according to the present invention.
Figure 1B:
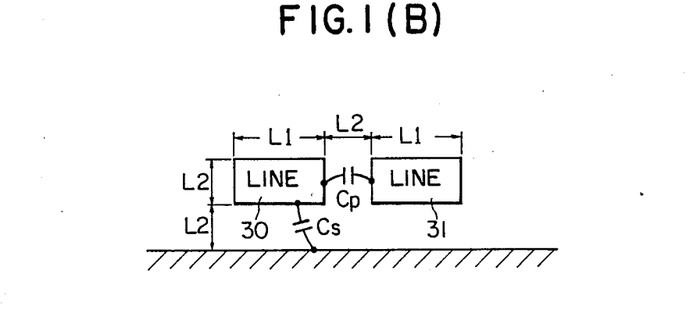
FIG. 1(B) is a sectional view of the delay circuit of FIG. 1(A)

Referring to FIGS. 1(A) and 1(B), a delay circuit, in a first embodiment, according to the present invention is included, for example, in an integrated circuit (hereinafter, abbreviated as an "IC"). The delay circuit has a first line 30 having an input terminal 30a and an output terminal 30b, and a second line 31 having an input terminal 31a and an output terminal 31b and extended near the first line 30. A first signal, for example, a clock signal $\phi$, is applied to the input terminal 30a of the first line 30. A second signal, for example, a clock signal $\phi$ or a clock signal $\bar{\phi}$ of a phase opposite to that of the clock signal $\phi$, is applied to the input terminal 31a of the second line 31. The first line 30 has a section L1 in width and L2 in thickness. The first line 30 is disposed at a distance L2 from the ground and has an capacitance of Cs to ground. The second line 31 is disposed near the first line 30 so that the first line 30 and the second line 31 are coupled by a coupling capacitance Cp of a value which will affect the delay time of the clock signal $\phi$ carried by the first line 30. For example, the second line 31 has a section L1 in width and L2 in thickness. The second line is formed at a distance L2 in a layer in which the first line 30 is formed or in a different layer separated by a dielectric layer such as a silicon oxide film from the layer in which the first line 30 is formed. When L1 : L2=2 : 1, (Cs+Cp) : Cp=1 : 0.30. The input terminal 31a of the second line 31 is connected to a pad 33 or a pad 34 by a wire 32. The clock signal $\phi$ or the clock signal $\bar{\phi}$ of the opposite phase is applied through the pad 33 or the pad 34 to the input terminal 31a of the second line 31.

When the clock signal $\phi$ is applied to the input terminal 30a of the first line 30 and the clock signal of opposite phase $\bar{\phi}$ is applied through the pad 34 and the wire 32 to the input terminal 31a of the second line 31, the coupling capacitance Cp between the first line 30 and the second line 31 is increased almost to 2Cp by the Miller effect. When the clock signal $\phi$ of the same phase is applied through the pad 33 and the wire 32 to the input terminal 31a of the second line 31, the potential of the second line 31 coincides with that of the first line 30, and the coupling capacitance Cp is reduced to a negligibly small value. Thus, the delay time Tpd of the clock signal $\phi$ carried by the first line 30 can be varied by using the second line 31 for controlling the two-dimensional capacitance between the first line 30 and the second line 31.

Figure 2A:
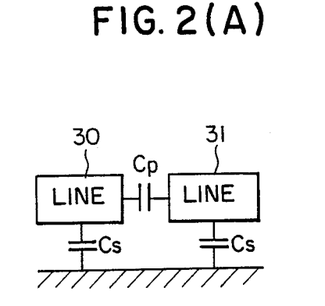
FIGS. 2(A), 2(B) and 2(C) are diagrammatic illustrations of assistance in explaining simulation tests of the delay circuit of FIG. 1(A)
Figure 2B:
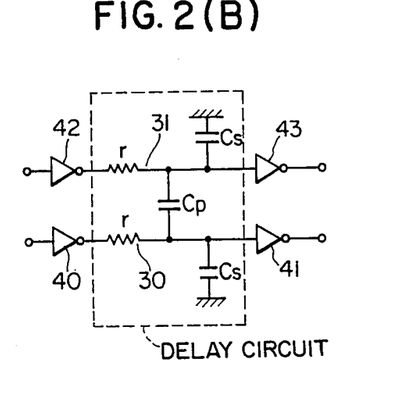
Figure 2C:
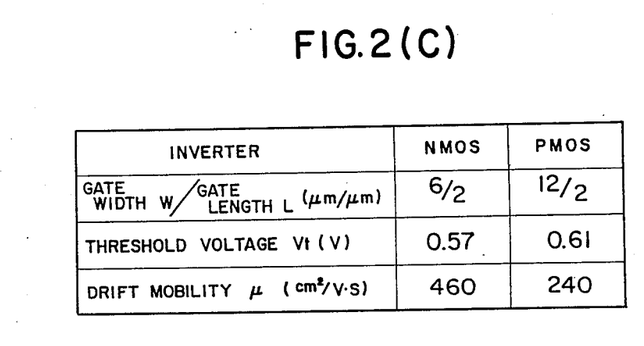

The delay circuit was subjected to simulation tests under test conditions shown in FIGS. 2(A), 2(B) and 2(C). In FIG. 2(A), the respective earth capacitance Cs of the first line 30 to ground and the second line 31 to ground are 2 pF, the coupling capacitance Cp is 0.6pF, and the respective resistances r of the first line 30 and the second line 31 are 100Ω. FIG. 2(B) is an equivalent circuit of the delay circuit of FIG. 2(A).

Inverters 40 and 41 each comprising a complementary metal oxide semiconductor transistor (hereinafter, abbreviated to as "CMOS") consisting of an n-channel metal oxide semiconductor transistor (hereinafter, abbreviated as "NMOS") and a p-channel metal oxide semiconductor transistor (hereinafter, abbreviated as "PMOS") are connected respectively to the input terminal and output terminal of the first line 30. Inverters 42 and 43 each comprising an NMOS transistor and a PMOS transistor are connected to the input terminal and output terminal of the second line 31. The gate width W, gate length L, threshold voltage Vt and drift mobility of the NMOS transistors and PMOS transistors of the inverters 40 to 43 are tabulated in FIG. 2(C).

Figure 3:
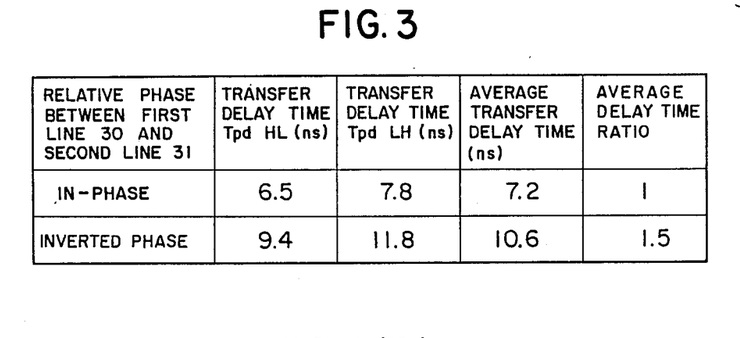
FIG. 3 is a table showing the results of simulation tests of the delay circuit of FIG. 1(A)

When the clock signals $\phi$ of the same phase were applied respectively through the inverters 40 and 42 to the first line 30 and the second line 31, the transfer delay time Tpd HL was 6.5 nsec when the input signal applied to the inverter 41 went from an H-level to an L-level, the transfer delay time Tpd LH was 7.8 nsec when the same input signal went from an L-level to an H-level, and the average transfer delay time AVE was 7.2 nsec. When the clock signal $\phi$ was applied through the inverter 40 to the first line 30, and the clock signal $\bar{\phi}$ was applied through the inverter 42 to the second line 31, the transfer delay time Tpd HL was 9.4 nsec when the input signal applied to the inverter 41 went from an H-level to an L-level, the transfer delay time Tpd LH was 11.8 nsec when the input signal went from an L-level to an H-level, and the average transfer delay time AVE was 10.6 nsec. Thus, the ratio of the average transfer delay time AVE in the latter case to that in the former case is 1.5, that is, the transfer delay time in the latter case is greater than that in the former case by 50% of the transfer delay time in the former case.

The first embodiment has the following advantages.

(1) The delay circuit is able to delay the clock signal $\phi$ applied to the first line 30 without using any delay element such as those employed in the conventional delay circuits as shown in FIGS. 11 and 13, and hence the delay circuit can be simplified and thereby space for forming the delay circuit can be saved.

(2) The delay circuit is able to change the delay time without using any switch such as the switches 25 and 26 employed in the conventional delay circuit as shown in FIG. 13, and hence the delay circuit can be simplified and thereby space for forming the delay circuit can be saved.

(3) The coupling capacitance Cp between the first line 30 and second line 31 of the delay circuit can be reduced to a negligibly small value by applying the clock signals $\phi$ of the same phase respectively to the first line 30 and the second line 31, so that the delay time can be reduced to the least extent, whereby the performance of the delay circuit can be improved.

(4) Since the clock signal $\phi$ or the clock signal $\bar{\phi}$ of the opposite phase is applied to the second line 31, floating does not occur and thereby the first line 30 is protected from noise.

(5) Three delaying modes can be obtained by holding the second line 31 at a fixed potential.

(6) The first line 30 and the second line 31 need not be the same in length, in width and in thickness and in the distance from the ground and need not be parallel to each other. However, it is desirable that the respective portions of the first line 30 and the second line 31 extending in parallel to each other are long enough for the effective utilization of the Miller effect, and that a dielectric layer having a large specific inductive capacitance, such as a layer of $Si_3N_4$, is formed between the first line 30 and the second line 31, or that the first line 30 and the second line 31 have a large thickness relative to the distance from the ground to increase the coupling capacitance Cp.

A delay circuit, in a second embodiment, according to the present invention will be described hereinafter. This delay circuit is provided, for example, in an IC.

Figure 4A:
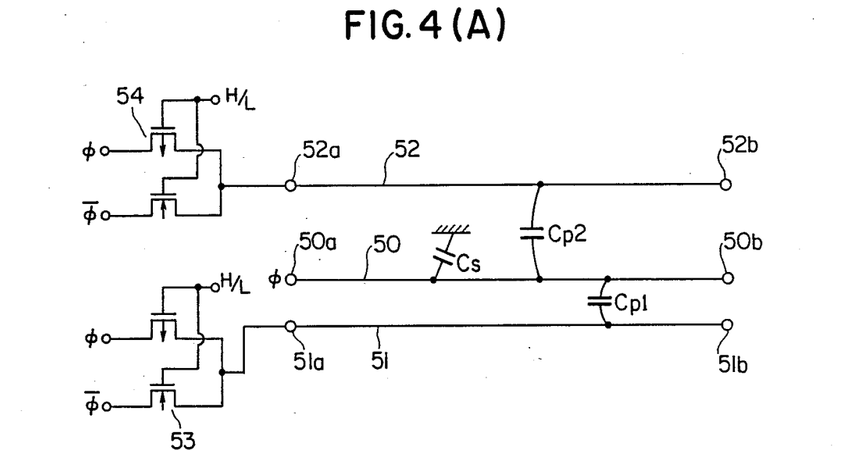
FIG. 4(A) is a circuit diagram of a delay circuit, in a second embodiment, according to the present invention.
Figure 4B:
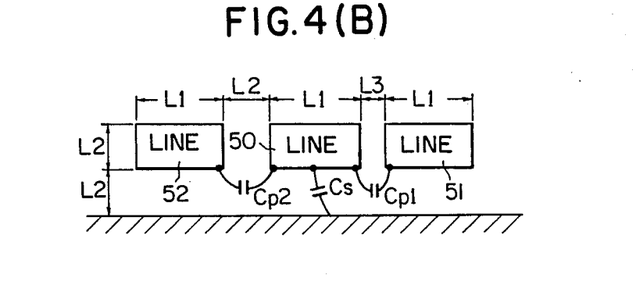
FIG. 4(B) is a sectional view of the delay circuit of FIG. 4(A)

Referring to FIGS. 4(A) and 4(B), the delay circuit has a first line 50 having one end connected to an input terminal 50a to which a clock signal $\phi$ is applied and the other end connected to an output terminal 50b, and two second lines 51 and 52 extended near the first line 50. The second lines 51 and 52 are connected respectively to input terminals 51a and 52a, and respectively to output terminals 51b and 52b. The input terminals 51a and 52a are connected respectively to transfer gates 53 and 54 for signal switching. The transfer gates 53 and 54 respectively apply a clock signal $\bar{\phi}$ of a phase opposite to that of the clock signal $\phi$ to the input terminals 51a and 52a upon the reception of a control signal of H-level and respectively apply a clock signal $\phi$ to the input terminals 51a and 52b upon the reception of a control signal of an L-level. The first line 50 and the second lines 51 and 52 each have a section of L1 in width and L2 in thickness and are each disposed at a distance L2 from the ground. The first line 50 and the second line 51 are separated from each other by a distance L3, and the first line 50 and the second line 52 are separated from each other by a distance L2. A ground capacitor Cs is connected to the first line 50. The first line 50 is coupled to the second line 51 by a coupling capacitor Cp1 and to the second line 52 by a coupling capacitor Cp2.

In this delay circuit, the combination of the capacitors can be varied in four ($2^2$) combinations with respect to the first line 50 by selectively applying the clock signals $\phi$ and the clock signals $\bar{\phi}$ of the opposite phase to the second lines 51 and 52. That is, the capacitance of the first line 50 is Cs when the clock signals $\phi$ are applied to the second lines 51 and 52, is approximately Cs+2Cp2 when the clock signal $\phi$ is applied to the second line 51 and the clock signal $\bar{\phi}$ of the opposite phase is applied to the second line 52, and is approximately Cs+2Cp1 when the clock signal $\bar{\phi}$ of the opposite phase is applied to the second line 51 and the clock signal $\phi$ is applied to the second line 52, and is approximately Cs+2Cp1+2Cp2 when the clock signals $\bar{\phi}$ of the opposite phase are applied to the second lines 51 and 52, and hence four delay time can be determined accordingly.

Figure 5A:
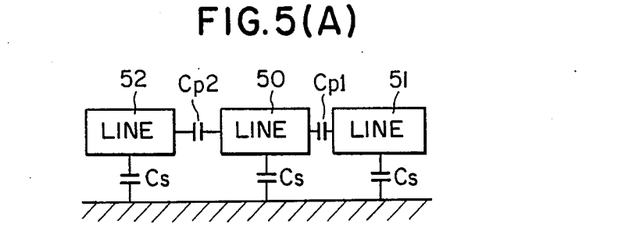
FIGS. 5(A) and 5(B) are diagrammatic illustrations of assistance in explaining simulation tests of the delay circuit of FIG. 4(A)
Figure 5B:
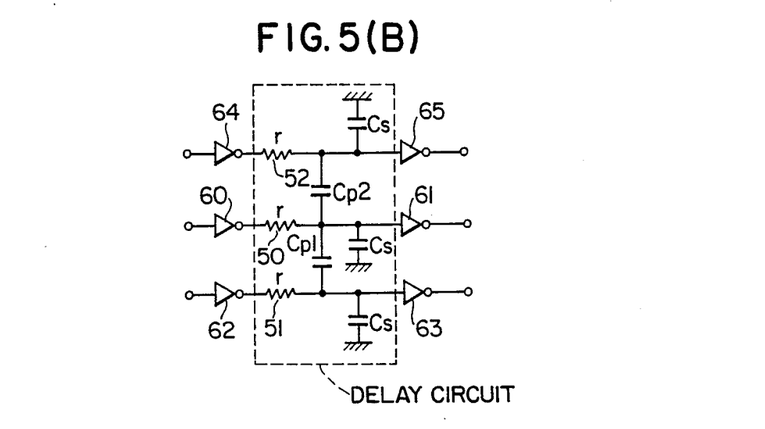

The delay circuit was subjected to simulation tests in a test arrangement as shown in FIGS. 5(A) and 5(B).

Referring to FIG. 5(A), the respective ground capacitors Cs of the second lines 51 and 52 are 2pF, the coupling capacitor Cp1 is 0.6 pF, the coupling capacitor Cp2 is 0.3 pF and the respective resistances r of the lines 50, 51 and 52 are 100 Ω.

Referring to FIG. 5(B) showing an equivalent circuit of the delay circuit of FIG. 5(A), inverters 60 and 61 each comprising a CMOS device consisting of an NMOS transistor and a PMOS transistor were connected respectively to the input terminal and output terminal of the first line 50. Like inverters 62 and 63 and like inverters 64 and 65 were connected respectively to the input terminal and output terminal of the second line 51 and respectively to the input terminal and output terminal of the second line 52 as shown in FIG. 5(B). Then, the first line 50 and the second lines 51 and 52 were driven for simulation. The specifications of the NMOS transistors and the PMOS transistors of the inverters 60 to 65 are the same as those shown in FIG. 2(C).

Figure 6:
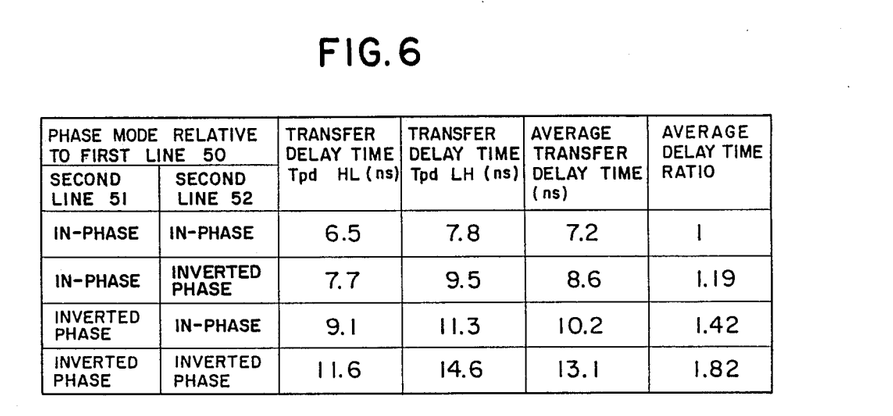
FIG. 6 is a table showing the results of the simulation tests of the delay circuit of FIG. 4(A)

The results of the simulation tests are tabulated in FIG. 6. When the clock signals : were applied through the inverter 60 to the first line 50, through the inverter 62 to the second line 51 and through the inverter 64 to the second line 52, the transfer delay time Tpd HL was 6.5 nsec when the input signal applied to the inverter 61 went from an H-level to an L-level, the transfer delay time Tpd LH was 7.8 nsec when the input signal applied to the inverter 61 went from an L-level to an H-level, and the average transfer delay time AVE was 7.2 nsec. Similarly, when the clock signal $\phi$ and the clock signal $\bar{\phi}$ of the opposite phase were applied selectively to the second lines 51 and 52, the transfer delay time Tpd and the average transfer delay time AVE varied as shown in FIG. 6. From FIG. 6, when the average transfer delay time AVE obtained by applying the clock signals $\phi$ to the second lines 51 and 52 is used as unity, the average transfer delay time AVE when the clock signal $\phi$ and the clock signal $\bar{\phi}$ of the opposite phase are applied respectively to the second lines 51 and 52 is 1.19 (an increment of 19%), the average transfer delay when the clock signal $\bar{\phi}$ of the opposite phase and the clock signal $\phi$ are applied respectively to the second lines 51 and 52 is 1.42 (an increment of 42%), and the average transfer delay time AVE when the clocks signals $\phi$ are applied respectively to the second lines 51 and 52 is 1.82 (an increment of 82%). The magnitude of the capacitance varies according to the distances between the first line 50 and the second line 51 and between the first line 50 and the second line 52 owing to the Miller effect, and the transfer delay time can be increased in steps by 19% to 82% by selectively applying the clock signal $\bar{\phi}$ of the opposite phase to the second lines 51 and 52.

The second embodiment has the following advantages.

(1) The same advantages as the advantages (1), (3), (4) and (6) of the first embodiment.

(2) A plurality of values of delay time can be obtained selectively through the on-off control of the transfer gates 53 and 54, which expands the function of the delay circuit.

(3) The control signal of an H-level and the control signal of an L-level for the on-off control of the transfer gates 53 and 54 can be selected according to data stored in a memory such as a ROM, a PROM an EPROM or an EEPROM, or can be selected by the operation of a microprocessor according to a control program stored in a RAM, so that the selective application of the clock signals to the second lines, hence, the control of the delay time, can be achieved by software.

A delay circuit, in a third embodiment, according to the present invention will be described hereinafter.

Figure 7:
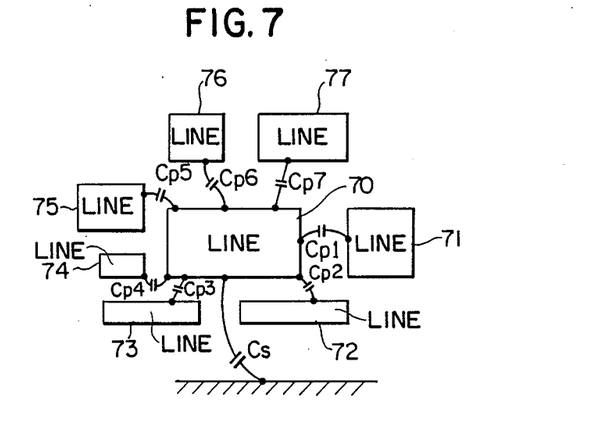
FIG. 7 is a sectional view of a delay circuit, in a third embodiment, according to the present invention.

Referring to FIG. 7, the delay circuit has a first line 70, and seven second lines 71 to 77 arranged near and around the first line 70. The second lines 71 to 77 are coupled to the first line 70 respectively by coupling capacitors Cp1 to Cp7. The first line 70 is connected to the ground by a ground capacitor Cs. The delay time of the first line 70 can be varied in 128 ($2^7$) steps by varying the combination of the ground capacitor Cs and the coupling capacitors Cp1 to Cp7, and the function of the delay circuit is thereby expanded and the same advantages as those of the second embodiment can be obtained.

FIGS. 8, 9(A), 9(B) and 10 illustrate modifications of the input arrangement for applying the clock signal $\phi$ or the clock signal $\bar{\phi}$ of the opposite phase to the lines.

Figure 8:
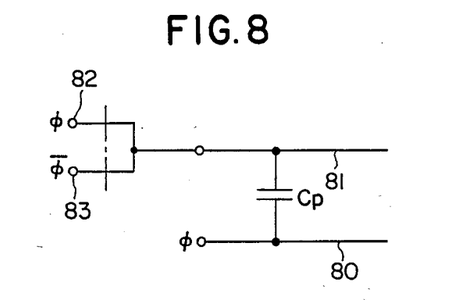
FIGS. 8, 9(A), 9(B) and 10 are diagrams showing the modifications of the input arrangement of the delay circuit of the present invention.

An input arrangement shown in FIG. 8 is provided, for example, in an IC. The device has a first line 80 to which the clock signal $\phi$ is applied, and a second line 81 arranged near the first line 80. These is of course a coupling capacitance Cp between the lines 80 and 81 as well as ground capacitances (not shown) between lines 80 and 81 and ground. This is also true for the arrangements shown in FIGS. 9(A), 9(B) and 10. The input of the second line 81 is connected to both an input terminal 82 to which the clock signal $\phi$ is applied and an input terminal 83 to which the clock signal $\bar{\phi}$ of the opposite phase is applied. The delay time of the first line 80 can be determined by cutting either the input terminal 82 or the input terminal 83 with a laser beam or the like to select either the clock signal $\phi$ or the clock signal $\bar{\phi}$ of the opposite phase.

Figure 9A:
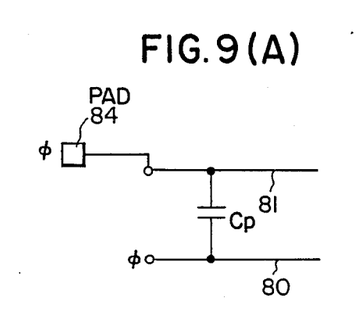
Figure 9B:
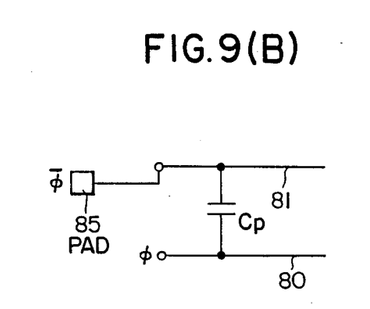

An input arrangement shown in FIGS. 9(A) and 9(B) also is provided, for example, in an IC. The input of a second line 81 is connected to a pad 84 to which the clock signal $\phi$ is applied and to a pad 85 to which the clock signal $\bar{\phi}$ of the opposite phase is applied. In forming a gate array in a wiring layer, a mask is formed so as to connect the pad 84 and the second line 81 as shown in FIG. 9(A) or a mask is formed so as to connect the pad 85 and the second line 81 as shown in FIG. 9 (B) so as to selectively determine the delay time of a first line 80.

Figure 10:
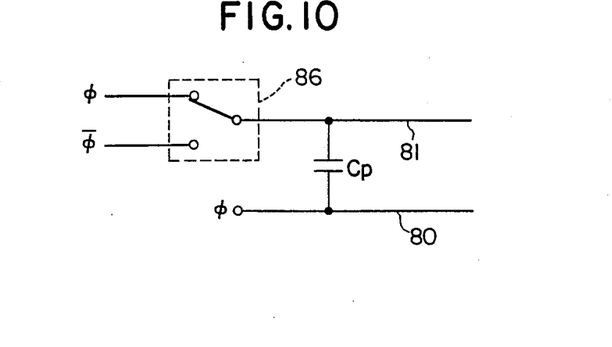

An input arrangement shown in FIG. 10 is provided, for example, in a printed wiring board. The input of a second line 81 is connected to a mechanical switch 86, such as a DIP switch, and the clock signal $\phi$ or the clock signal $\bar{\phi}$ of the opposite phase is applied selectively to the second line 81 to determine the delay time of a first line 80.

As is apparent from the foregoing description, according to the present invention, a second line is provided near a first line for transferring a first signal and a second signal of the same phase as that of the first signal or of a phase opposite to that of the first signal is applied to the second line to vary the delay time in transferring the first signal through the first line due to the Miller effect. Accordingly, the delay circuit of the present invention need not be provided with any delay element, has a simple construction, can be formed in a small area to save space, and is capable of accurately determining the delay time.

Although the invention has been described in its preferred forms with a certain degree of particularity, obviously many changes and variations are possible therein. It is therefore to be understood that the invention may be practiced otherwise than specifically described herein without departing from the scope and spirit thereof.

What is claimed is:

1. A delay circuit device utilizing the Miller effect comprising:
   a dielectric layer;
   a first elongated signal line disposed on the dielectric layer;
   a second elongated signal line spaced at a predetermined distance from the first elongated signal line and disposed in parallel with the first elongated signal line;
   wherein a coupling capacitance is formed between the first and the second signal lines;
   a first clock signal source electrically connected to the first signal line for supplying a first clock signal to the first signal line; and
   a second clock signal source electrically connected to the second signal line for supplying a second clock signal of an opposite phase to that of the first clock signal to the second signal line, whereby the second clock signal is applied to the first signal line via the coupling capacitance so as to delay the phase of the first clock signal of the first signal line.

2. A delay circuit device utilizing the Miller effect according to claim 1, wherein the dielectric layer is one of either $SiO_2$ and $Si_3N_4$.

3. A delay circuit device utilizing the Miller effect according to claim 1, further including a third signal line disposed on the dielectric layer in parallel with the first signal line, and a third clock signal source electrically connected to the third signal line for supplying a clock signal.

4. A delay circuit device utilizing the Miller effect according to claim 1, further including a transfer gate connected to the second signal line for selectively transmitting the first clock signal or the second clock signal to the second signal line.

5. A delay circuit device utilizing the Miller effect according to claim 4, wherein the transfer gate is controlled on the basis of data stored in a memory device.

6. A delay circuit device utilizing the Miller effect comprising;
   a ground plane;
   a first elongated signal line disposed above said ground plane;

at least one other elongated signal line disposed above said ground plane and having at least a portion thereof in parallel with said first signal line such that a coupling capacitance is formed therebetween;

a first means for providing a first clock signal to said first signal line;

a second means for selectively providing either said first clock signal or a second clock signal opposite in phase to that of said first clock signal to each of said at least one other elongated signal lines;

wherein the phase of said first clock signal of said first signal line is selectively delayed in phase in accordance with signals provided by said second means to said at least one other elongated signal lines.

* * * * *